AUTOMATIC GAIN CONTROL APPARATUS FOR PULSE SIGNAL HANDLING SYSTEMS
Filed May 14, 1962

INVENTOR.
GEORGE F. MORRIS
BY
T. L. Styner
ATTORNEY 3,199,044

AUTOMATIC GAIN CONTROL APPARATUS FOR PULSE SIGNAL HANDLING SYSTEMS

George F. Morris, Pittsford, N.Y., assignor to General Dynamics Corporation, Rochester, N.Y., a corporation of Delaware Filed May 14, 1962, Ser. No. 194,556
7 Claims. (Cl. 330—134)

This invention relates to automatic gain control circuits and is particularly directed to improved means for controlling the gain of an amplifier which may be subjected to violent and wide signal amplitude fluctuations.

The normal automatic gain control circuit of a radio receiver rectifies a portion of the intermediate frequency and applies the resulting direct current voltage to one or more of the control electrodes of the amplifiers in the system. Such direct current is normally obtained in circuits having relatively long time constants so that the gain control voltage is slow-acting and is suitable for holding the receiver output nearly constant throughout a wide range of signal amplitude change caused by fading. Where the signal level changes suddenly, however, the slow AGC circuit cannot respond and the receiver may become momentarily or permanently inoperative. Unfortunately, if the time constant of the AGC circuit is reduced so that there is fast reaction to signal changes, there inevitably results phase distortion of the signal in the amplifier. If unintegrated portions of the amplified signal are fed back, the receiver may actually become unstable, and self-sustained oscillations may result. In radio navigation systems, even momentary receiver inoperativeness cannot be tolerated. In tacan systems, for example, the distance or azimuth indicating meters may become unreliable because of violent changes in signal level. The wing of a maneuvering airplane has been found to cover and uncover the antenna and cause the tacan receiver to cease to function.

An object of this invention is to provide an automatic gain control system which obviates the above-mentioned shortcomings of the conventional AGC circuits.

A more specific object of this invention is to provide an improved automatic gain control circuit which provides all of the advantages of both a slow and a fast reacting control voltage without the disadvantages of either.

The objects of this invention are attained by sampling the amplified signal and feeding a direct current component thereof back to the gain control circuits of the amplifier, the time constant of the control circuits being relatively long. In addition, a fast reacting, but noncontinuous, AGC voltage is obtained from a signal sample and is fed back to the gain control circuits. The second control circuit is intermittent in that it functions to suppress amplification immediately upon receipt of sudden strong signals. Thereafter the control is returned to the slow circuits.

Other objects and features of this invention will become apparent to those skilled in the art by referring to the specific embodiment of the invention described in the following specification and shown in the accompanying drawing in which.

Figures 1, 2, 3:
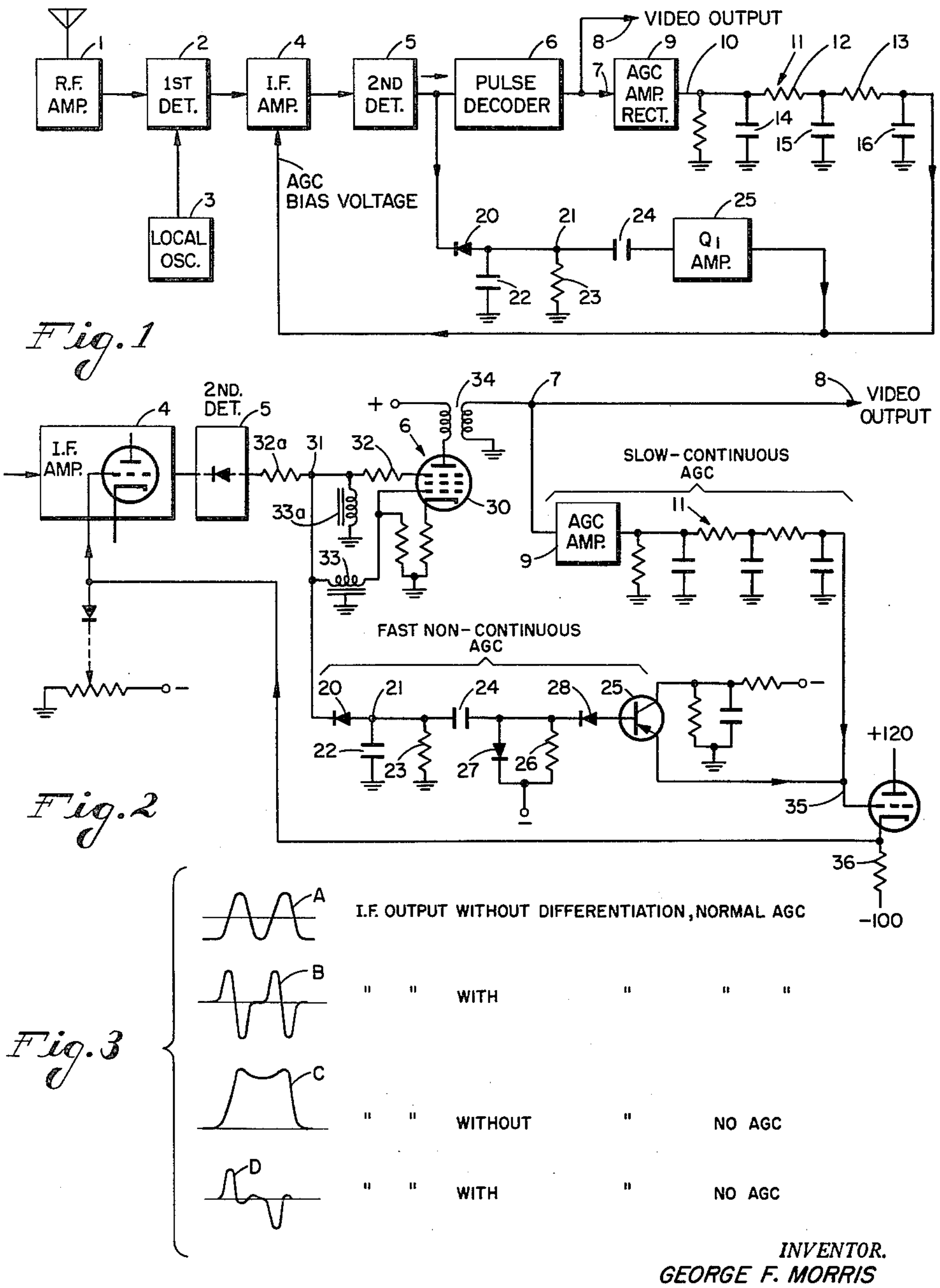
FIG. 1 is a block diagram of a receiver embodying this invention.
FIG. 2 is a schematic circuit diagram of a portion of the receiver of FIG. 1 embodying this invention.
FIG. 3 is a family of waveforms illustrative of the operation of the circuits of FIG. 1.

A tacan receiver is referred to here because it is typical of one radio receiver which cannot tolerate blocked amplifiers or inoperative gain control circuits. The receiver shown in FIG. 1 comprises a signal channel including the radio frequency amplifier 1 followed by the first detector 2 in which the signal frequency is reduced by the local oscillator 3. The resulting intermediate frequency is amplified in amplifier 4 and is detected in the second detector 5. By way of example, the radio frequency received at the antenna may be of the order of one thousand megacycles. Such a carrier is modulated by pulses of one or two microseconds in duration. In tacan, the pulses are normally transmitted in pairs, the pairs being precisely spaced. The pulse spacing in the now standardized tacan systems is precisely twelve microseconds, although spacings between pulse pairs are random. An airborne transceiver interrogates a ground-based beacon and, because of the random nature of the pulse pairs, receives only desired reply pulse pairs. The received pulse pairs are decoded and gated into the distance indicating meter of the airborne equipment.

In FIG. 1, the pulse pairs appear at the output of the second detector 5 and are applied to the pulse decoder 6 to produce at the output terminal 7 a single pulse for each received pair of pulses. From terminal 7, the decoded pulses are applied at 8 to the distance measuring circuits as well as to automatic gain control circuits. Preferably, the automatic gain control amplifier 9 with rectifier is employed. At the output terminal 10 of the amplifier appears a direct current voltage proportional in amplitude to the video signal, which is smoothed in the filter network 11 comprising series resistances 12 and 13 and shunt condensers 14, 15 and 16. In the example of FIG. 1, the smoothed AGC voltage is negative-going and is applied to one or more gain control electrodes of the intermediate frequency amplifier 4.

Curve A of FIG. 3 shows the pulse pair signal that appears at the output of the second detector 5. The waveform is the envelope of the pulsed microwave energy received at the antenna. To precisely determine the spacing between the two pulses, they are preferably differentiated in the second detector so that relatively sharp voltage spikes occur on the steepest portion of the ascending portion of the received pulses. The differentiated pulses are shown at B in FIG. 3. The negative portions of the differentiated pulses are eliminated by rectification. The waveforms A and B remain relatively uniform in amplitude, even though fading may vary widely the antenna signal, because of the automatic gain control voltages at 10 applied to the I.F. amplifier 4. The voltage spikes B are accepted by the pulse decoder 6 to produce the desired single pulse at output 7. When, however, a strong signal is suddenly applied to the receiver input, the slow AGC voltage fails to respond, the amplifiers saturate, and the two pulses merge into a single wide pulse, such as shown at C in FIG. 3.

Since the decoder will yield an output only when it receives two positive pulses twelve microseconds apart, or when it receives a single wide pulse of duration greater than twelve microseconds, there can be no voltage generated at point 7 once the two I.F. output pulses have merged. With no gain control voltage, the I.F. amplifiers saturate, the receiver is completely locked up, or blocked, and the received pulses of either high or low amplitude canot be detected. Where the pulse signals are differentiated, the waveform at the decoder input consists of a single, narrow, positive pulse, as shown at D in FIG. 3, in time coincidence with the leading edge of the wide pulse. The differentiated wide pulse is, of course, followed by a single, narrow, negative pulse in coincidence with the trailing edge of the wide pulse and serves no useful purpose.

To prevent the loss of signals at the output of the decoder, a second automatic gain control circuit is added.

The sample voltage from which an AGC voltage may be derived is obtained at any point in the receiver which reliably yields a signal voltage regardless of gain control. In FIG. 1, the sampled voltage is obtained at the output of the second detector 5 where the leading edge of any video signal appears whether or not the video signal may be acceptable to the decoder 6. The sampled voltage is rectified by the rectifier 20 to produce a direct current voltage at point 21. To remove ripple or other signal components from the direct current voltage, the smoothing circuit including condenser 22 and resistance 23 is connected across the output of the rectifier 20. The RC time constant of the smoothing circuit must be long enough to remove modulation and noise ripple, but must be short enough to charge condenser 22 when a strong signal is suddenly received, and apply an AGC voltage to the receiver before the receiver becomes inoperative. The coupling capacitor 24, according to an important feature of this invention, differentiates the voltage at point 21 and couples the steep increase in direct current voltage at point 21 directly to the gain control circuits of amplifier 4. Conversely, capacitor 24 isolates or blocks all AGC voltages having a rate of change, $dV/dT$, less than a predetermined minimum. That is, the capacitor 24 prevents continuous encoded pulses of normal amplitude and of normal variations in amplitude from establishing a continuous AGC voltage. While the capacitor 24 must be large enough to couple sufficient energy to operate the rather low impedance of the feedback circuit, the capacitor, on the other hand, must be small enough to discharge quickly when a strong signal is suddenly reduced. To meet such conflicting requirements, the amplifier 25 may be inserted in the fast noncontinuous AGC loop to decrease the impedance load across the time constant circuit 22–23.

In FIG. 2 is shown one schematic diagram of the two gain control circuits of this invention. The intermediate frequency amplifier 4 may comprise one or more amplifier stages. Where the amplifiers are of the electron discharge type, the gain of the amplifier is regulated by the control grids. The second detector 5 applies the video signal, normally pulse pairs, to the decoder 6. If the pulses are flattened and lack the desired sharpness for decoding purposes, the pulses may be differentiated. Inductance 33*a* across the grid circuit and resistance 32*a* in series is one differentiation circuit which will produce at point 31 the waveform B, FIG. 3. The particular decoder shown for sensing pulse pairs comprises the pentode 30. The video signal at point 31 is applied without delay through resistor 32 to the suppressor grid of the pentode. The same video signals are applied through the delay line 33 to the control grid of the pentode. Where the delay of the delay line is twelve microseconds, say, a pulse pair spaced twelve microseconds will energize the control and suppressor grids simultaneously. The bias voltages and parameters of the pentode are so chosen that a useful output appears at transformer 34 only when both grids are simultaneously pulsed positively. The single output pulse appearing at the output transformer 34 is directed to the video output 8 as well as to the AGC amplifier 9. As explained in connection with FIG. 1, the smoothing network 11 has a relatively long time constant and produces a direct current voltage, proportional to decoded pulses, which direct current is continuously fed back to the gain control circuits of the amplifier 4. Preferably, this automatic gain control current is amplified in the cathode follower 35, the cathode resistor 36 being coupled as shown to the gain control circuits of amplifier 4.

The noncontinuous AGC circuit is connected ahead of the decoder. Rectifier 20 is connected between point 31 and point 21 where the resulting direct current voltage is smoothed in the time constant circuit 22–23. As stated, the coupling and blocking condenser 24 is sufficient in size to couple only relatively sharp changes in voltage at point 21 to the amplifier 25. In the example shown, amplifier 25 is a P-N-P type transistor, with a base biased negatively through resistance 26 and clamping diode 27. The emitter is connected directly into the input of cathode follower 35 in parallel with the output from the slow AGC filter 11.

In operation, the continuous AGC circuit controls the gain of amplifier 4 in the normal manner to level slowly changing signals. When, however, a sudden strong signal appears, and the video output at point 7 disappears, the fast noncontinuous AGC circuit immediately responds, driving the gain control circuits of amplifier 4 out of blocking condition. Where the tacan signals comprise pulse pairs spaced twelve microseconds apart, and the pulse pairs are randomly spaced, good results have been obtained to prevent inoperativeness by the following components. Condensers 22 is 0.1 microfarad, resistor 23 is 1.0 megohm, condenser 24 is 1.0 microfarad, and the diodes 20, 27 and 28 are of the commercially available 1N663 types. With these constants, the discontinuous AGC circuit is operative only during the time required for the continuous AGC circuit to assume control.

What is claimed is:

1. A navigation radio receiver for detecting pairs of pulses of radio frequency energy of prescribed spacing, said receiver comprising a variable gain amplifier, a detector coupled to said amplifier for producing pairs of voltage pulses corresponding to said pairs of pulses of radio frequency, a decoder coupled to the output of said detector for producing an output pulse when pulses of said prescribed spacing occur in the detector output; a first automatic gain control circuit, said circuit being coupled between the output of said decoder and the gain control electrode of said amplifier for continuously adjusting the amplifier gain according to output pulse amplitude, a second automatic gain control circuit, said second circuit being coupled between the input of said decoder and said gain control electrode, and a blocking condenser in said second circuit for affecting said gain control electrode only in response to signal voltages which change relatively rapidly.

2. Automatic gain control apparatus for a system including a pulse amplifier followed by a pulse decoder for providing an output when input signals to said pulse decoder satisfy a certain code, said apparatus comprising (a) an automatic gain control feedback circuit responsive to said pulse decoder output for continuously applying a gain control voltage to said pulse amplifier, and (b) a gain control loop responsive to said pulse decoder input signals for feeding back gain control voltages to said pulse amplifier in response to signals which change relatively rapidly, said loop including signal differentiating means.

3. A system for deriving information from repetitive pulse signals subject to variations in amplitude and which are transmitted through a signal channel, which channel includes a variable gain amplifier which, when conditioned to provide relatively high gain, blocks rapidly repetitive signals of relatively high amplitude, said system comprising (a) a pulse decoder coupled to said channel following said amplifier for providing outputs when successive ones of said pulse signals occur in a certain rapid time sequence, (b) means responsive to said outputs for adjusting the gain of said amplifier, and (c) means coupled to said channel between said amplifier and said decoder responsive to relatively rapid increases in the amplitude of said signals for reducing the gain of said amplifier whereby to prevent blocking of said rapid signals by said amplifier.

4. A pulse signal handling system comprising (a) a variable gain amplifier for amplifying said pulse signals, (b) a pulse decoder having an input and an output and responsive to output signals from said amplifier for providing signals at its said output when, and only when, said pulse signals occur in predetermined time relationship, (c) a first automatic gain control circuit connected between said amplifier and said pulse decoder output for continuously adjusting the gain of said amplifier in response to the amplitude of the output signals from said pulse decoder, (d) and a second automatic gain control circuit connected between said amplifier and said pulse decoder input and responsive to the rate of change of the amplitude of the input signals to said decoder for adjusting the gain of said amplifier when and only when the amplitude of said pulse signals change at a relatively rapid rate.

5. A system for deriving information from repetitive pulse signals which are subject to variation in amplitude and which are transmitted through a signal channel, which channel includes a variable gain amplifier, said system comprising (a) a pulse decoder in said channel following said amplifier for providing outputs when successive ones of said pulse signals have a certain time relationship, (b) means for deriving from said outputs a first direct current voltage which varies in accordance with slow variations in amplitude of said outputs, (c) means for deriving from signals transmitted through that portion of said channel between said amplifier and said pulse decoder a second direct current voltage which is representative of the amplitude of said signals, (d) means responsive to said second voltage for applying to said amplifier an automatic gain control signal, when and only when, the amplitude of said second voltage increases at greater than a certain rate, and (e) means for applying to said amplifier, as another automatic gain control signal, said first direct current voltage.

6. A receiver for pulse radio freguency signals comprising (a) a variable gain amplifier, (b) a detector coupled to said amplifier for deriving output pulses corresponding to said pulse radio frequency signals, (c) a pulse decoder responsive to said output pulses for deriving information signals when said pulses occur in certain sequence, (d) circuit means responsive to said information signals for providing a control signal and applying said control signals to said amplifier as a continuous automatic gain control signal, and (e) circuit means responsive to said output pulses for providing another control signal and applying said other control signal discontinuously to said amplifier as an automatic gain control signal only in response to rapid changes in amplitude of said pulses with respect to each other.

7. A tacan receiver for detecting pulses of radio frequency energy which have certain time relationship, said receiver comprising (a) a variable gain amplifier, (b) a detector coupled to said amplifier for providing voltage pulses corresponding to receiver radio frequency energy pulses, (c) a pulse decoder coupled to said detector for providing output pulses each when a pair of said voltage pulses have said certain time relationship, (b) a first automatic gain control circuit connected between the output of said decoder and said amplifier, said first automatic gain control circuit including (i) means for rectifying and filtering said output pulses for deriving a first direct current voltage which varies in accordance with the amplitudes of said output pulses, and (ii) means for applying said first direct current voltage to said amplifier as an automatic gain control voltage, and (e) a second automatic gain control circuit connected between said amplifier and the output of said detector, said second automatic gain control circuit including (i) means for rectifying and filtering said voltage pulses for deriving a second direct current voltage which varies in accordance with the amplitudes of said voltage pulses, (ii) means for differentiating said second direct current voltage for providing the differential thereof, and (iii) means for applying said differential of said second direct current voltage to said amplifier as a second automatic gain control voltage.

References Cited by the Examiner

UNITED STATES PATENTS

| | | | |
|---|---|---|---|
| 2,472,301 | 6/49 | Koch | 325—404 |
| 2,706,810 | 4/55 | Jacobsen | 328—119 |
| 3,009,058 | 11/61 | Bodez | 325—326 |

ROY LAKE, *Primary Examiner.*